(12) United States Patent
Jamieson

(10) Patent No.: US 8,125,087 B2
(45) Date of Patent: Feb. 28, 2012

(54) HIGH-DENSITY FLIP-CHIP INTERCONNECT

(75) Inventor: Mark P. Jamieson, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 1966 days.

(21) Appl. No.: 09/789,401

(22) Filed: Feb. 20, 2001

(65) Prior Publication Data

US 2002/0113307 A1 Aug. 22, 2002

(51) Int. Cl.
*H01L 23/52* (2006.01)
(52) U.S. Cl. ......... 257/778; 257/774; 257/777; 257/786
(58) Field of Classification Search .................. 257/773, 257/774, 777, 778, 786
See application file for complete search history.

(56) References Cited

U.S. PATENT DOCUMENTS

| | | |
|---|---|---|
| 5,424,492 A | 6/1995 | Petty et al. |
| 5,475,236 A * | 12/1995 | Yoshizaki ..................... 257/48 |
| 5,741,726 A * | 4/1998 | Barber ........................ 438/125 |
| 5,812,379 A | 9/1998 | Barrow |
| 5,906,042 A * | 5/1999 | Lan et al. ...................... 29/830 |
| 5,986,893 A | 11/1999 | Leigh et al. |
| 6,011,695 A | 1/2000 | Dumke |
| 6,121,554 A | 9/2000 | Kamikawa |
| 6,310,398 B1 * | 10/2001 | Katz .............................. 257/773 |
| 6,344,696 B2 * | 2/2002 | Nakamura et al. ............ 257/668 |

FOREIGN PATENT DOCUMENTS

| | | | |
|---|---|---|---|
| EP | 1 098 555 A2 | | 5/2001 |
| JP | 05129366 A | * | 5/1993 |

OTHER PUBLICATIONS

Republic of the Philippines Department of Trade and Industry Intellectual Property Office Bureau of Patents; No. 6 Office Action; Application/Serial No. 1-2003-500908; Filed: Sep. 19, 2003; pp. 1.
European Patent Office: Office action mailed May 22, 2006: Application No. 02 703 307.5-2203; Ref. P/2468.EP/MWM; pp. 4.
Korean Intellectual Propert Office; Office Action (translation) ; Application No. 10-2003-7010895; mailed Jul. 4, 2006; pp. 6.

* cited by examiner

*Primary Examiner* — Matthew E Warren
(74) *Attorney, Agent, or Firm* — Blakely, Sokoloff, Taylor & Zafman LLP

(57) ABSTRACT

An interconnect routing for a card or interposer or the like, including splines of traces on a first layer and traces on a second layer, with vias connecting between the layers. Outer rows of signals are routed out from a chip on the first layer, while inner rows of signals are viad down to the second layer where they are routed out, then viad back up to the first layer. These outer vias are arranged in an arc, enabling the second layer trace segments to be of a more uniform length. The second layer may also include ground or power plane fingers extending between the splines and viad up to ground or power signals of the chip.

26 Claims, 7 Drawing Sheets

HIGH-DENSITY FLIP-CHIP INTERCONNECT

BACKGROUND OF THE INVENTION

1. Technical Field of the Invention

The present invention relates generally to interconnect technology for routing signals through a multi-layer board, and is especially useful with flip-chip packaging.

2. Background Art

FIG. 1 illustrates, in cross-section, a motherboard coupled, such as by solder balls, to an interposer or other substrate, hereinafter referred to as a "card". The card is coupled, such as by solder bumps, to a chip such as a flip-chip die, and illustrates one exemplary embodiment of the layers of such, according to the prior art. In the illustrated example, the card has five layers of structural material (board layers A-F), and six layers of traces or interconnects (trace layers 3F, 2F, 1FC, 1BC, 2B, and 3B), while a simplified motherboard is shown having only one structural layer (motherboard) and one trace or interconnect layer (m/b trace layer). The reader will appreciate that this is by way of example only.

Typically, the uppermost one or two interconnect layers, such as trace layer 3F and trace layer 2F, are used for routing of large numbers of input/output (I/O) signals, memory signals, clocks, strobes, voltage references, and the like (hereinafter collectively referred to as "I/O signals" for simplicity in explanation and not by way of limitation), while the lower layers are used for providing power, ground, shielding, and the like. Signals are routed between trace layers using vias. Power and ground planes may suitably be routed or coupled between adjacent layers using drilled vias. However, drilled vias may often be too large to be suitable for use in routing signals between the upper layers. In that case, one option is to use micro-vias (µvias) which may be formed by etching or the like at a much smaller scale than drilling would permit.

Please continue to make reference to FIG. 1 throughout the remainder of this patent.

FIG. 2 illustrates, in top view, an exemplary routing of such signals according to the prior art. For ease in reading FIG. 2, the general outline of the flip-chip die is shown by the dotted box 10, and an edge of the card is shown by the dashed line 5. A plurality of bumps 12 are distributed on the flip-chip die and/or the card in a pattern. Some of those bumps are for carrying I/O signals and some are for carrying power and ground signals. Typically, the I/O signals will be connected to other chips (not shown) on the motherboard; thus, it is desirable to route those signals using the generally outer bumps (such as those labeled 14 and 16) of the flip-chip die, and to use the generally inner bumps (such as those labeled 12) for power and ground.

In some high-density or high-signal-count applications, the I/O signal count and/or the I/O bump density may be such that it is difficult or impossible to route all of the I/O signals on the uppermost trace layer 3F. In such applications, some of the I/O signals are routed on the uppermost trace layer (such as 24 and others illustrated by solid lines extending from their respective bump to the "to circuitry" indication), while other I/O signals are routed from their respective bumps down through micro-vias 17 (shown in hidden lines) to a lower trace layer such as trace layer 2F, outward to a location where the design rules and physical dimensions permit, then back up through a micro-via (such as 18) to the uppermost trace layer, and from there to their destinations. The signals which are carried below the uppermost layer are illustrated by dashed lines such as 20, and after being micro-viad back to the top layer they are illustrated by solid lines such as 22.

However, the prior art has limited ability to route large numbers of signals in high-density applications, and other limitations.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1:
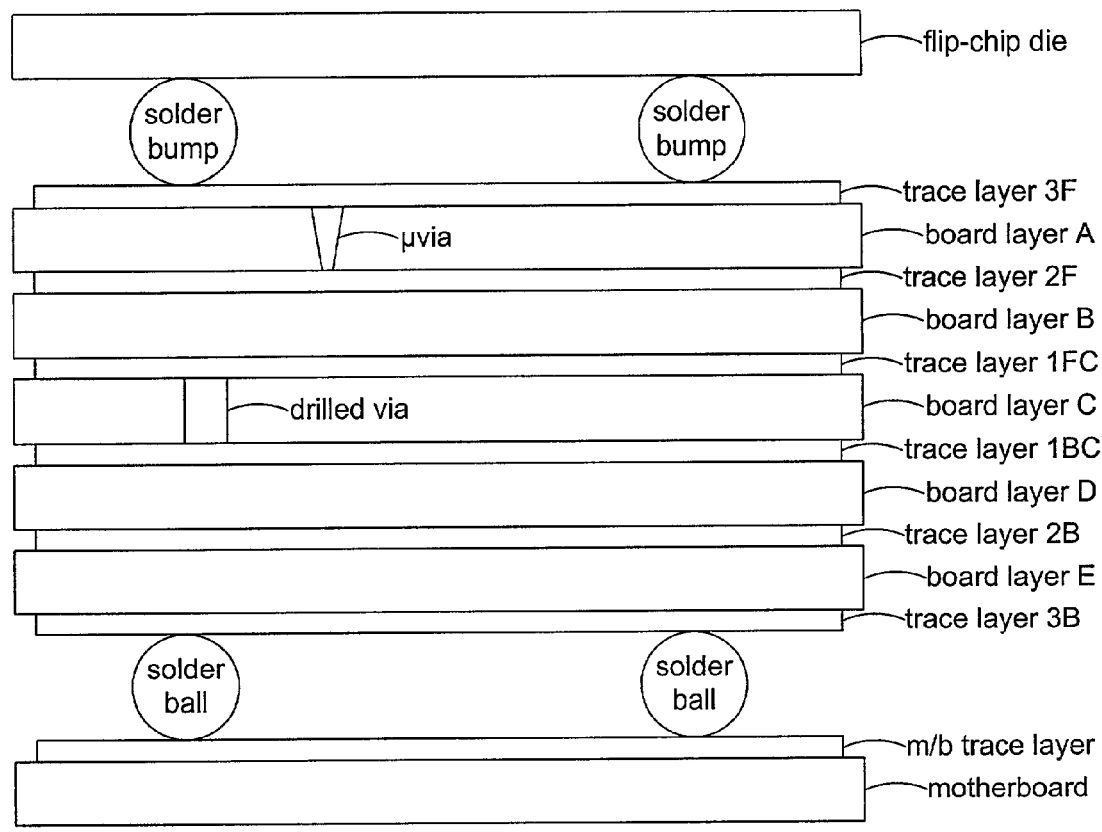
FIG. 1 shows, in cross-section, a flip-chip die, a substrate, and a motherboard, with exemplary layers shown, according to the prior art.
Figure 2:
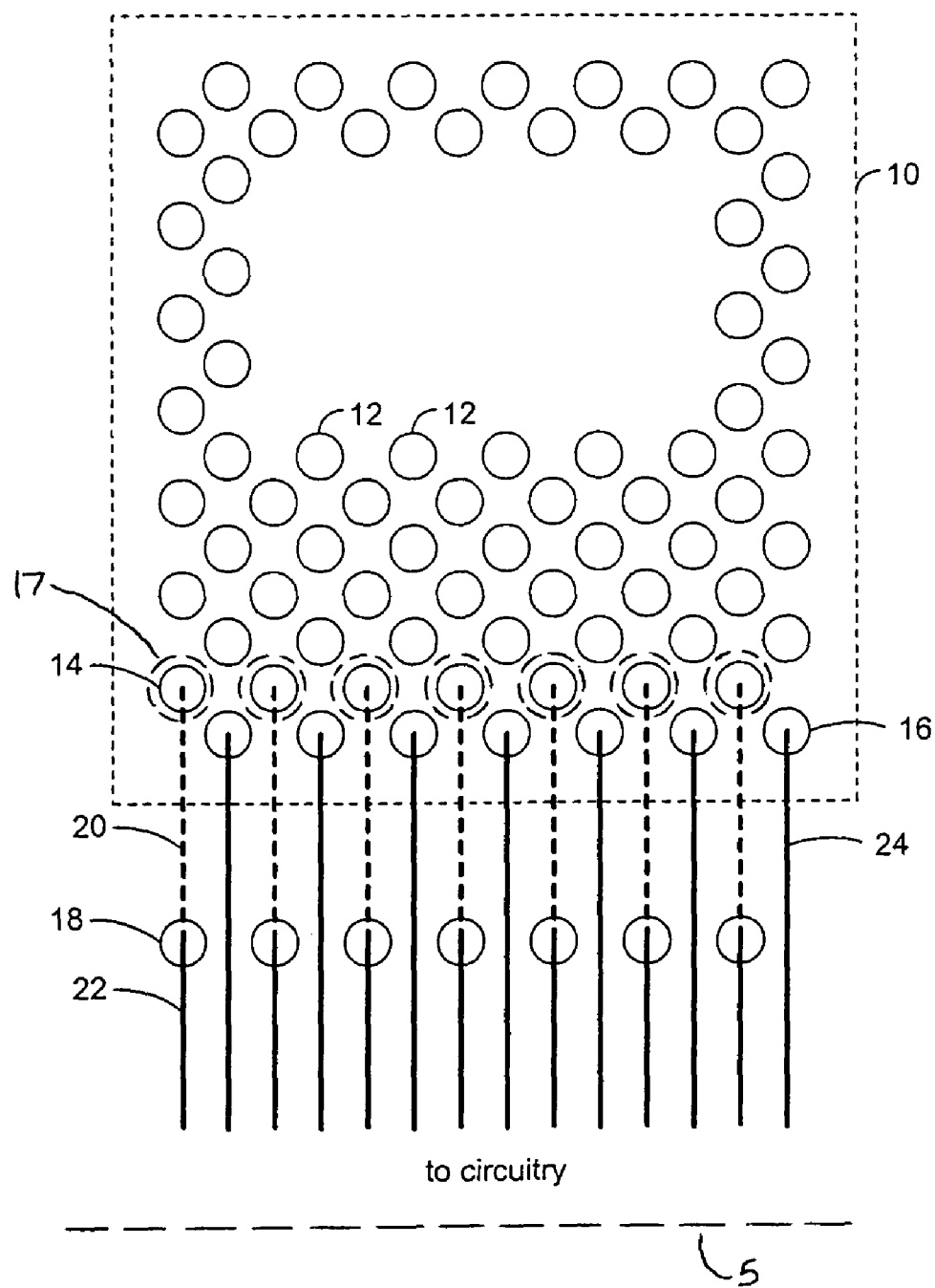
FIG. 2 shows an interconnect routing system according to the prior art.
Figure 3:
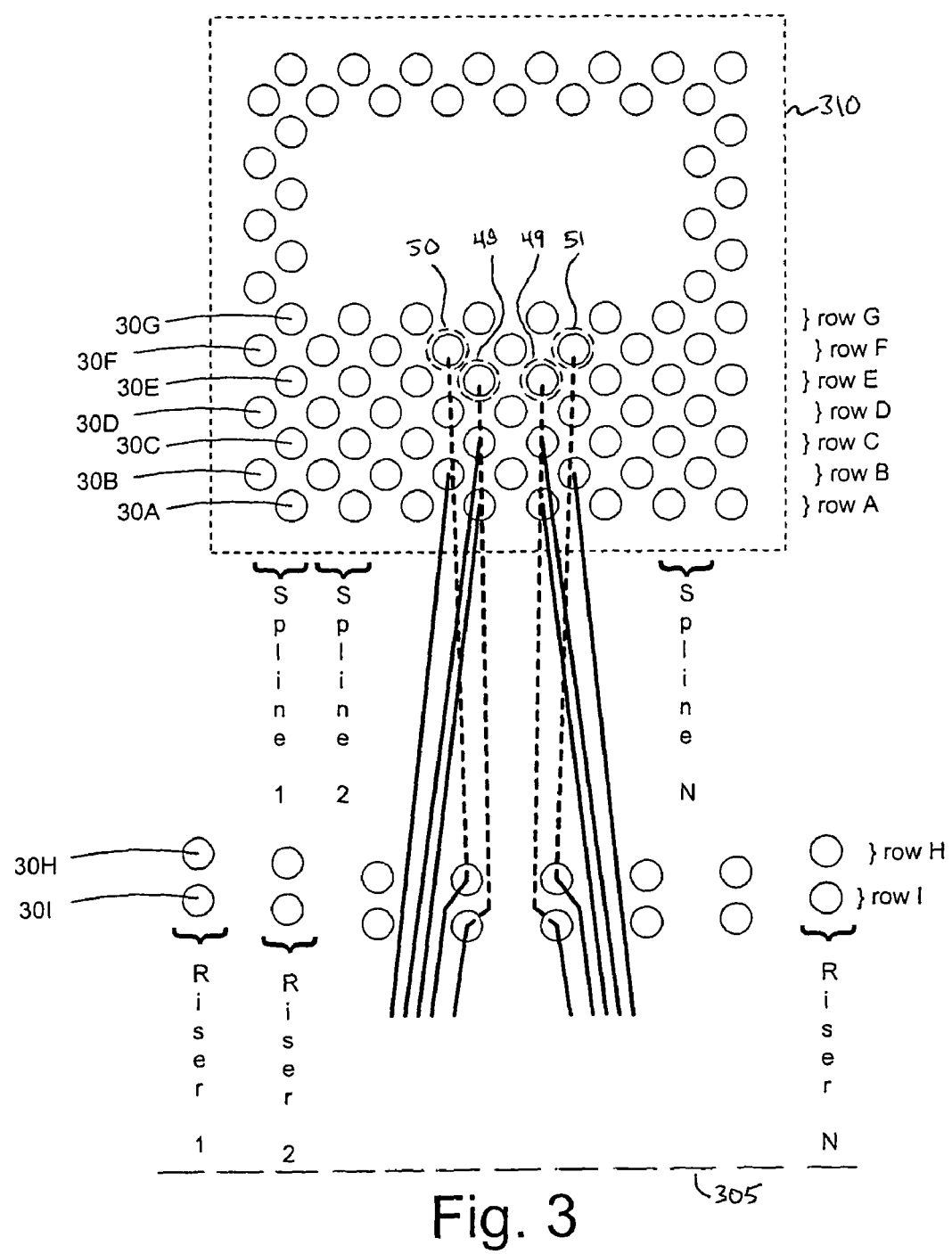
FIG. 3 shows one embodiment of the interconnect routing system of this invention.

FIG. 3 illustrates one exemplary embodiment of the interconnect system of this invention. As before, a dotted box 310 indicates the location of a flip-chip die, and a dashed line 305 indicates an edge of a card. There are a plurality of bumps 30 distributed within the area where the die and card (meaning substrate, interposer, or the like) connect. Various groups of the bumps may be distributed in one or more repeating patterns. An instance of a group of bumps that repeats may be termed a "spline". The term "spline" may also be used to refer to a group of traces, bumps, vias, or combination thereof corresponding to a spline of the die. The illustrated pattern includes seven bumps 30A-G which make up a spline (Spline 1), and that pattern repeats itself to form additional splines (Spline 2 through Spline N). For ease in reference, the bumps may be considered as being arranged in rows, with an outermost row (row A) being nearest the flip-chip die's edge, and one or more additional rows (such as row B through row G) each residing sequentially closer to the center or core of the flip-chip die. As illustrated, the splines may in some embodiments mirror image at some point on the chip. For example, Spline 1 and Spline N are mirror images of each other. In the embodiment shown, the splines mirror image and leave some non-spline bumps between them. Disposed in the card 305 and underlying at least some of the bumps are micro-vias 48, 49, 50, 51 (shown in hidden line). In FIG. 3, the micro-vias 48-51 are shown slightly larger than the bumps for ease of illustration; however, it should be understood that these micro-vias may have any suitable size and dimension relative to the bumps.

The card has one or more rows of micro-vias (such as 30H and 30I) arranged in one or more rows (such as row H and row I). These micro-vias are for returning I/O signals from a deep layer to a less deep layer. Typically, this will be from the next-to-uppermost layer (2F) to the uppermost layer (3F), but the skilled reader will appreciate that the principles of this invention are not necessarily limited to that application. For ease in explanation only, this patent will use the terms "top layer" and "buried layer".

One or more of the splines may have corresponding groups of the distant micro-vias. Each such group may be termed a "riser", such as Riser 1 through Riser N.

The top layer traces and buried layer traces are illustrated for two splines and their associated risers, for simplicity in illustration. The skilled reader will appreciate that any number of the splines may be coupled to their respective I/O signal destinations in this manner.

Figure 4:
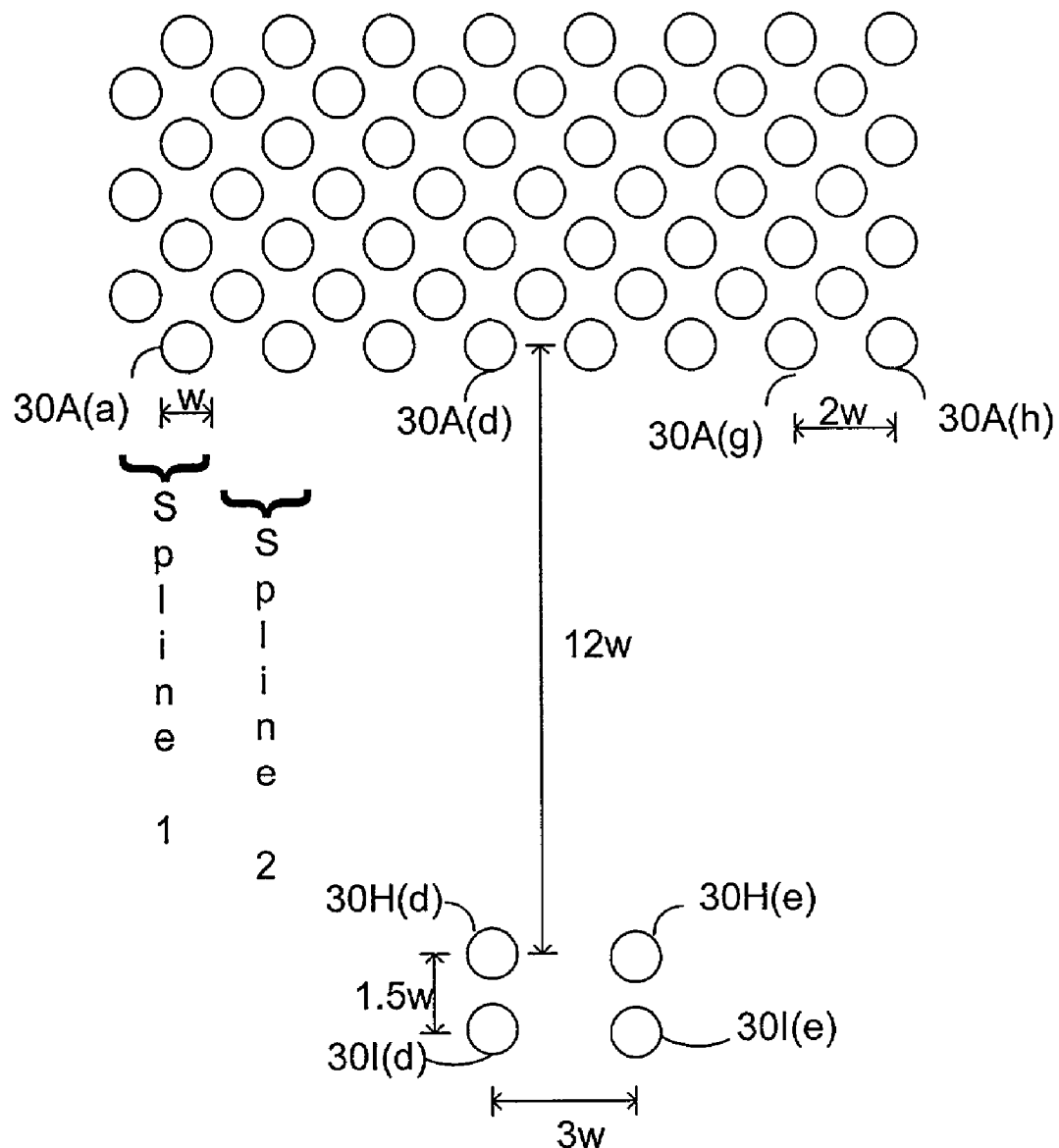
FIG. 4 shows spacing details of one embodiment of the invention.

FIG. 4 illustrates one exemplary spacing of the bumps and micro-vias in a spline and its riser. The skilled reader will appreciate that this is only an example, and not necessarily a limitation on the invention. The reader will further appreciate that it is not necessarily required that, for example, the bumps be circular, nor that the bumps all be of the same size, nor that the micro-vias be of the same size as the bumps, and so forth.

In one embodiment, a bump (such as bump 30A(a)) has a width "w", and the bumps in a row are on 2w centers (such as bumps 30A(g) and 30A(h)). In one embodiment, the risers are located such that the on-center distance from the outermost row of bumps (row A) to the nearest row of riser micro-vias (row H) (which may be termed the "breakout length") is approximately 12w (such as from bump 30A(d) to micro-via 30H(d). The micro-vias within a given riser are located on approximately 1.5w centers (such as from micro-via 30H(d) to micro-via 30I(d)), while the risers are at roughly 3w spacing (such as from micro-via 30I(d) to micro-via 30I(e)). The skilled reader will appreciate that this is but one example, and that the sizes and spacings for any particular application will be dictated by such things as the available manufacturing technology, the number and type of I/O signals, the cross-coupling and noise requirements, impedance targets, and so forth.

Figure 5:
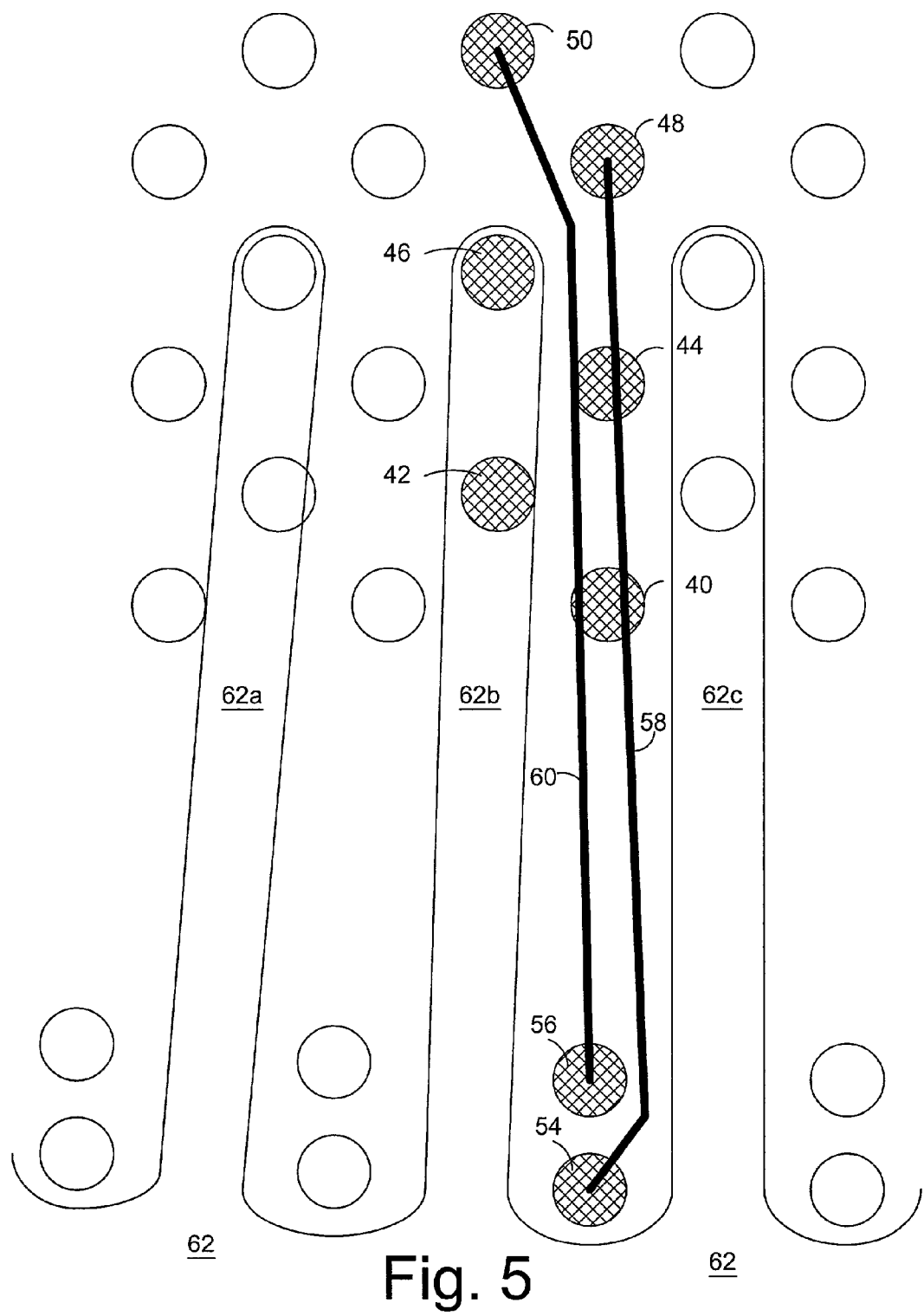
FIG. 5 shows routing details of one embodiment of the invention, particularly showing the routing of signals between micro-vias in a trace layer beneath the uppermost trace layer.

FIG. 5 illustrates one exemplary embodiment of the micro-vias, signal traces, and ground plane on the buried layer. Bumps 40, 42, and 44 are actually at the top layer, but are shown here for reference of the spacing. Micro-vias 48 and 50 route I/O signals down from the bumps through the top layer to the buried layer. Traces 58 and 60 carry those signals to micro-vias 54 and 56, which route the signals back to the top layer. The reader will appreciate that the traces 58 and 60 do not connect to bumps 40 or 44, as those bumps are not present on the buried layer; they merely overlay the traces 58 and 60.

By providing more than one row of riser micro-vias, an increased number of breakout signals may be utilized.

In one embodiment, a row of bumps between the top layer traces' bumps (such as rows A-C) and the buried layer traces' bumps (such as rows E-F) is used for ground, power, or other reference. In one such embodiment, that row is used in conjunction with a ground plane 62. The ground plane includes a plurality of "fingers" (such as 62a-c) which extend inward past the risers to connect to the micro-vias 46, which connect to ground bumps on the die. The fingers 62a-c carry the return path current for their respective splines' and risers' signals. Because the fingers 62a-c, the buried signal traces 58 and 60, and the micro-vias 48, 50, 54, and 56, are on the same layer, they should be fabricated so as to not touch each other. The fingers provide a ground (or power) return path for the signals, and they provide a reference plane for the signals which are breaking out on the top layer.

Figure 6:
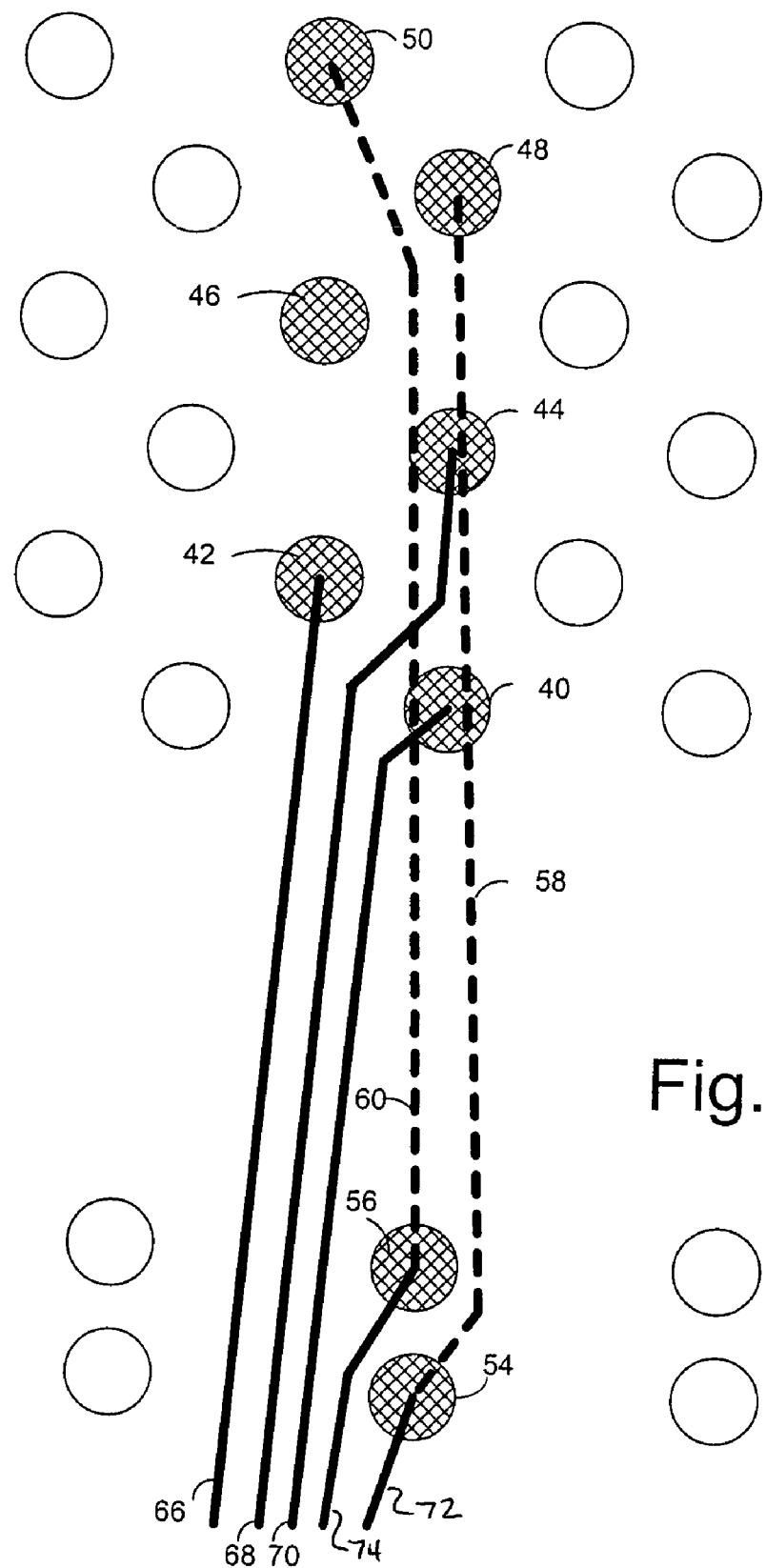
FIG. 6 shows routing details of one embodiment of the invention, particularly showing the routing of signals in the uppermost layer and a lower layer.

FIG. 6 illustrates further details of the exemplary embodiment shown in FIG. 5. At the top layer, the signal from bump 42 is routed on trace 66, the signal from bump 44 is routed on trace 68, and the signal from bump 40 is routed on trace 70 to their respective destinations. Also at the top layer, the signals coming back up from micro-vias 54 and 56 are routed on trace segments 72 and 74, respectively. Thus, for example, a logic or chip (not shown) coupled to the trace 72 is ultimately connected to the flip-chip connector coinciding with the bump 48.

The skilled reader will appreciate that, in order to minimize cross-coupling and other undesirable effects, it is desirable to minimize the distance over which top layer signals directly overlay buried layer signals.

In one embodiment, a maximum breakout signal count may be achieved by routing three I/O signals on the top layer and two I/O signals on the buried layer. In other embodiments, in which the design rules dictate otherwise, other signal counts may prove better.

In one embodiment, a given spline's top layer I/O signals are routed adjacent one another, and that spline's buried layer I/O signals are brought up to the top layer and then routed adjacent to that spline's top layer I/O signals.

In one embodiment, the top layer I/O signals are routed on an outermost side of the spline's riser micro-vias. For example, in the view of FIG. 3, the top layer I/O signals for the splines on the left half of the flip-chip die (beginning with Spline 1) are routed on the left side of their respective corresponding risers, while the top layer I/O signals for the splines on the right half (ending with Spline N) are routed on the right side of their respective corresponding risers.

It is not necessarily the case that all risers must be equally spaced, as the reader will appreciate. For example, the two centermost risers may in some embodiments be placed much closer together than other adjacent pairs, in those embodiments where those risers' respective traces are routed on the outer sides of those risers. In some embodiments, the spacing may be different for each adjacent pair, depending upon design rules, varying numbers of signal traces that must pass between adjacent pairs, and so forth.

In one embodiment, in which for a spline three I/O signals are routed on the top layer and are taken from the outermost three rows of bumps (rows A-C), the trace from the third row bump (row C) is routed between the first and second row bumps.

In one embodiment, in which for a spline three I/O signals are routed on the top layer and two I/O signals are routed on the buried layer, the buried layer signals are taken from the fifth and sixth rows of bumps. In one embodiment, those buried layer signals are routed directly beneath the spline's first and third row bumps. In one embodiment, the fourth row bump is for ground. In one embodiment (such as shown in FIG. 3 as row G), a row of bumps inside the buried layer signal rows' bumps may be used to provide power.

Figure 7:
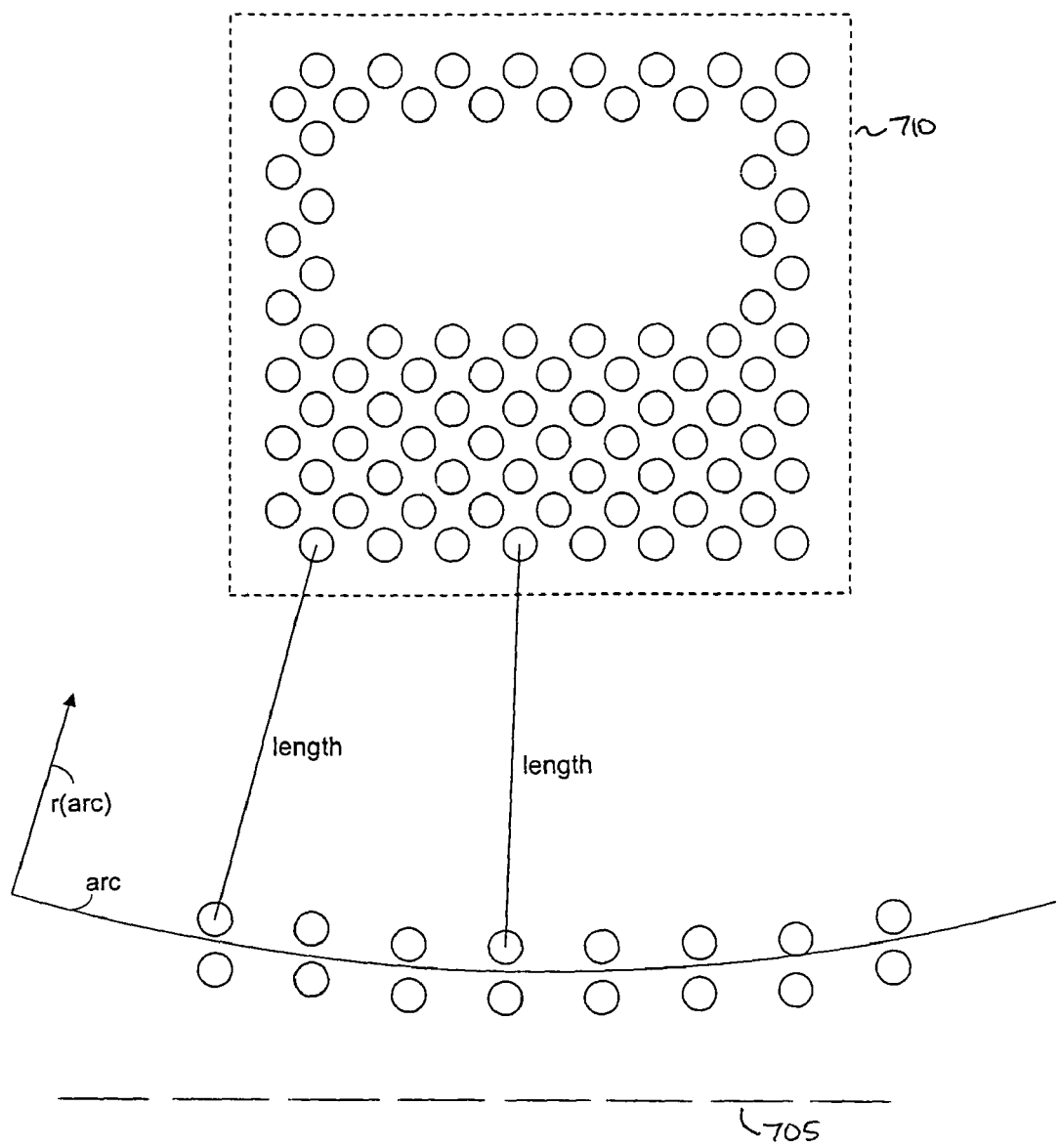
FIG. 7 shows one embodiment of an arrangement of micro-vias according to this invention.

FIG. 7 illustrates one embodiment of a placement of the riser micro-vias, which provides the shortest path for the signals on the buried layer to surface to the top layer. Once again, a dotted box 710 indicates the location of a die, and a dashed line 705 indicates an edge of a card. In applications where it is necessary to space the risers wider than the spacing of the splines, by distributing the risers generally in an arc, the buried layer I/O trace segments may be made to have reduced variation in their respective lengths. In one embodiment, the respective micro-vias within a given riser may still be placed in substantially rectilinear arrangement with respect to the rectilinear alignment of the splines. In other words, in one embodiment, the micro-vias in a riser do not need to be aligned in a radial tangent to the arc along which the risers are distributed. This rectilinear alignment may lend itself to easier simulation and validation, for example.

While the invention has been described with reference to embodiments utilizing solder bumps, non-drilled micro-vias, and other specifics, the reader will appreciate that the invention has ready applicability in conjunction with other technologies and that these points of discussion should not be interpreted as any sort of limitation on the scope of the invention. The term "connector" is used in the claims below to refer generically to any and all methodologies of connecting one element (such as a flip-chip or the like) to another element (such as a card or the like).

The invention has been described in terms of electrical signals and traces suitable for transmitting them, but has applicability in other technologies, such as optical interconnect, microwave transmission, and so forth. The card has been described in terms of a multi-layer board having sandwiched structural layers and trace layers, but the reader should understand that the invention has applicability in other technologies, such as those in which there is no structural stiffness required and thus no structural layers as such, or such as those in which interconnects are not referred to as "traces" per se, so long as there are multiple layers of transmission signal wires, lines, traces, fibers, or the like and the requirement of using multiple such layers in order to increase the signal breakout count or density. However, the term "trace" will be used in the claims to generically refer to any and all such means. These and other points of invention will be understood by the skilled reader upon thoughtful consideration of this patent.

Reference in to "upper" or "outermost" or "top" or "buried" or the like should not be interpreted as requiring any particular absolute orientation of the apparatus.

Reference to "breakout length" should not be interpreted as necessarily requiring that the riser micro-vias be beyond the physical edges of the flip-chip die, but only that they be beyond the bump area of the flip-chip die in their vicinity.

Reference to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An apparatus comprising:
a structural layer having an upper interconnect layer overlying a side thereof and a lower interconnect layer overlying an opposing side thereof;
a plurality of signal connectors formed in the upper interconnect layer and arranged to couple with a plurality of leads of a die, a number of the signal connectors comprising a spline, each signal connector of the spline located adjacent to at least one other signal connector of the spline;
a first row of riser vias and a second row of riser vias formed in the structural layer, each riser via of the first and second rows located outward of the plurality of signal connectors, a riser via of the first row and an adjacent riser via of the second row comprising a riser group associated with the spline;
a number of other vias formed in the structural layer, each of the other vias located in a region underlying the plurality of signal connectors;
a number of signal traces formed in the upper interconnect layer, a first of the upper interconnect layer signal traces coupled with a first signal connector of the spline and a second of the upper interconnect layer signal traces coupled with a second signal connector of the spline, the first and second upper interconnect layer signal traces extending outwardly from the spline and between the riser group and a directly adjacent riser group; and
a number of signal traces formed in the lower interconnect layer, a first of the lower interconnect layer signal traces coupled by a first of the other vias with a third signal connector of the spline and further coupled with a first riser via of the riser group, a second of the lower interconnect layer signal traces coupled by a second of the other vias with a fourth signal connector of the spline and further coupled with a second riser via of the riser group;
wherein the first and second riser vias of the riser group route the first and second lower interconnect layer signal traces to the upper interconnect layer, and wherein a third and fourth of the upper interconnect layer signal traces are coupled with the first and second riser vias, respectively, and extend outwardly from the riser group and adjacent to the first and second upper interconnect layer signal traces.

2. The apparatus of claim 1, wherein the first row of riser vias and the second row of riser vias are arranged in an arced formation.

3. The apparatus of claim 1, wherein a fifth of the upper interconnect layer signal traces is coupled with a fifth signal connector of the spline, the fifth upper interconnect layer signal trace extending outwardly from the spline and between the riser group and the directly adjacent riser group.

4. The apparatus of claim 1, wherein each of the plurality of signal connectors formed in the upper interconnect layer comprises a conductive bump.

5. The apparatus of claim 1, wherein each of the plurality of leads of the die comprises a conductive bump, each of the plurality of signal connectors formed in the upper interconnect layer to couple with one of the conductive bump leads of the die.

6. The apparatus of claim 1, further comprising:
a ground plane formed in the lower interconnect layer, the ground plane including a number of fingers;
wherein one of the other vias couples one of the fingers with one of the plurality of signal connectors in the upper interconnect layer.

7. An apparatus comprising:
a top trace layer overlying an upper surface of a structural layer;
a buried trace layer overlying a surface of another structural layer;
a plurality of signal connectors formed in the top trace layer and arranged to couple with a plurality of leads of a die, a number of the signal connectors comprising a spline, each signal connector of the spline located adjacent to at least one other signal connector of the spline;

a first row of riser vias and a second row of riser vias formed in the structural layer, each riser via of the first and second rows located outward of the plurality of signal connectors, a riser via of the first row and an adjacent riser via of the second row comprising a riser group associated with the spline;

a number of other vias formed in the structural layer, each of the other vias located in a region underlying the plurality of signal connectors;

a number of signal traces formed in the top trace layer, a first of the top trace layer signal traces coupled with a first signal connector of the spline and a second of the top trace layer signal traces coupled with a second signal connector of the spline, the first and second top trace layer signal traces extending outwardly from the spline and between the riser group and a directly adjacent riser group; and a number of signal traces formed in the buried trace layer, a first of the buried trace layer signal traces coupled by a first of the other vias with a third signal connector of the spline and further coupled with a first riser via of the riser group, a second of the buried trace layer signal traces coupled by a second of the other vias with a fourth signal connector of the spline and further coupled with a second riser of the riser group;

wherein the first and second riser vias of the riser group route the first and second lower interconnect layer signal traces to the upper interconnect layer, and wherein a third and fourth of the top trace layer signal traces are coupled with the first and second riser vias, respectively, and extend outwardly from the riser group and adjacent to the first and second top trace layer signal traces.

8. The apparatus of claim 7, wherein the buried trace layer overlies a lower surface of the structural layer.

9. The apparatus of claim 7, wherein the first row of riser vias and the second row of riser vias are arranged in an arced formation.

10. The apparatus of claim 7, wherein a fifth of the top trace layer signal traces is coupled with a fifth signal connector of the spline, the fifth top trace layer signal trace extending outwardly from the spline and between the riser group and the directly adjacent riser group.

11. The apparatus of claim 7, wherein each of the plurality of signal connectors formed in the top trace layer comprises a conductive bump.

12. The apparatus of claim 7, wherein each of the plurality of leads of the die comprises a conductive bump, each of the plurality of signal connectors formed in the top trace layer to couple with one of the conductive bump leads of the die.

13. The apparatus of claim 7, further comprising:
a ground plane formed in the buried trace layer, the ground plane including a number of fingers;
wherein one of the other vias couples one of the fingers with one of the plurality of signal connectors in the top trace layer.

14. An apparatus comprising:
a die having a plurality of leads disposed on a surface thereof;
a structural layer having an upper interconnect layer overlying a side thereof and a lower interconnect layer overlying an opposing side thereof;
a plurality of signal connectors formed in the upper interconnect layer, each of the signal connectors coupled with a corresponding one of the leads of the die, a number of the signal connectors comprising a spline, each signal connector of the spline located adjacent to at least one other signal connector of the spline;

a first row of riser vias and a second row of riser vias formed in the structural layer, each riser via of the first and second rows located outward of the plurality of signal connectors, a riser via of the first row and an adjacent riser via of the second row comprising a riser group associated with the spline;

a number of other vias formed in the structural layer, each of the other vias located in a region underlying the plurality of signal connectors;

a number of signal traces formed in the upper interconnect layer, a first of the upper interconnect layer signal traces coupled with a first signal connector of the spline and a second of the upper interconnect layer signal traces coupled with a second signal connector of the spline, the first and second upper interconnect layer signal traces extending outwardly from the spline and between the riser group and a directly adjacent riser group; and a number of signal traces formed in the lower interconnect layer, a first of the lower interconnect layer signal traces coupled by a first of the other vias with a third signal connector of the spline and further coupled with a first riser via of the riser group, a second of the lower interconnect layer signal traces coupled by a second of the other vias with a fourth signal connector of the spline and further coupled with a second riser via of the riser group wherein the first and second riser vias of the riser group route the first and second lower interconnect layer signal traces to the upper interconnect layer, and wherein a third and fourth of the upper interconnect layer signal traces are coupled with the first and second riser vias, respectively, and extend outwardly from the riser group and adjacent to the first and second upper interconnect layer signal traces.

15. The apparatus of claim 14, wherein the first row of riser vias and the second row of riser vias are arranged in an arced formation.

16. The apparatus of claim 14, wherein a fifth of the upper interconnect layer signal traces is coupled with a fifth signal connector of the spline, the fifth upper interconnect layer signal trace extending outwardly from the spline and between the riser group and the directly adjacent riser group.

17. The apparatus of claim 14, wherein each of the plurality of signal connectors formed in the upper interconnect layer comprises a conductive bump, the conductive bump coupled with the corresponding one lead of the die.

18. The apparatus of claim 14, wherein each of the plurality of leads of the die comprises a conductive bump, the conductive bump coupled with a corresponding one of the plurality of signal connectors formed in the upper interconnect layer.

19. The apparatus of claim 14, further comprising:
a ground plane formed in the lower interconnect layer, the ground plane including a number of fingers;
wherein one of the other vias couples one of the fingers with one of the plurality of signal connectors in the upper interconnect layer.

20. An apparatus comprising:
a die having a plurality of leads disposed on a surface thereof;
a top trace layer overlying an upper surface of a structural layer;
a buried trace layer overlying a surface of another structural layer;
a plurality of signal connectors formed in the top trace layer, each of the signal connectors coupled with a corresponding one of the leads of the die, a number of the signal connectors comprising a spline, each signal connector of the spline located adjacent to at least one other signal connector of the spline;

a first row of riser vias and a second row of riser vias formed in the structural layer, each riser via of the first and second rows located outward of the plurality of signal connectors, a riser via of the first row and an adjacent riser via of the second row comprising a riser group associated with the spline;

a number of other vias formed in the structural layer, each of the other vias located in a region underlying the plurality of signal connectors;

a number of signal traces formed in the top trace layer, a first of the top trace layer signal traces coupled with a first signal connector of the spline and a second of the top trace layer signal traces coupled with a second signal connector of the spline, the first and second top trace layer signal traces extending outwardly from the spline and between the riser group and a directly adjacent riser group; and a number of signal traces formed in the buried trace layer, a first of the buried trace layer signal traces coupled by a first of the other vias with a third signal connector of the spline and further coupled with a first riser via of the riser group, a second of the buried trace layer signal traces coupled by a second of the other vias with a fourth signal connector of the spline and further coupled with a second riser of the riser group;

wherein the first and second riser vias of the riser group route the first and second lower interconnect layer signal traces to the upper interconnect layer, and wherein a third and fourth of the top trace layer signal traces are coupled with the first and second riser vias, respectively, and extend outwardly from the riser group and adjacent to the first and second top trace layer signal traces.

21. The apparatus of claim 20, wherein the buried trace layer overlies a lower surface of the structural layer.

22. The apparatus of claim 20, wherein the first row of riser vias and the second row of riser vias are arranged in an arced formation.

23. The apparatus of claim 20, wherein a fifth of the top trace layer signal traces is coupled with a fifth signal connector of the spline, the fifth top trace layer signal trace extending outwardly from the spline and between the riser group and the directly adjacent riser group.

24. The apparatus of claim 20, wherein each of the plurality of signal connectors formed in the top trace layer comprises a conductive bump, the conductive bump coupled with the corresponding one lead of the die.

25. The apparatus of claim 20, wherein each of the plurality of leads of the die comprises a conductive bump, the conductive bump coupled with a corresponding one of the plurality of signal connectors formed in the top trace layer.

26. The apparatus of claim 20, further comprising:

a ground plane formed in the buried trace layer, the ground plane including a number of fingers;

wherein one of the other vias couples one of the fingers with one of the plurality of signal connectors in the top trace layer.

\* \* \* \* \*